United States Patent [19]

Hinds

[11] 4,119,843
[45] Oct. 10, 1978

[54] ARTICLE DETECTION SYSTEM WITH SYNCHRONOUS DEMODULATION

[75] Inventor: James J. Hinds, La Grange, Ill.

[73] Assignee: National Can Corporation, Chicago, Ill.

[21] Appl. No.: 767,897

[22] Filed: Feb. 11, 1977

[51] Int. Cl.² .......................................... G01D 21/04
[52] U.S. Cl. .............................. 250/222 PC; 340/600; 340/674
[58] Field of Search ................ 340/258 B; 250/221, 250/222 R, 214 B, 222 PC; 235/92 V, 92 PC; 356/209

[56] References Cited

U.S. PATENT DOCUMENTS

| | | | |
|---|---|---|---|
| 3,737,666 | 6/1973 | Dutro | 235/92 V |
| 3,852,592 | 12/1974 | Scoville et al. | 250/221 |
| 3,964,041 | 6/1976 | Hinds | 340/258 B |
| 3,983,373 | 9/1976 | Russell | 235/92 V |

Primary Examiner—David C. Nelms
Attorney, Agent, or Firm—Dressler, Goldsmith, Clement, Gordon & Shore, Ltd.

[57] ABSTRACT

An article detection system utilizing optical transducers in a transducer housing designed to minimize detection errors and including additional circuitry for minimizing errors in the processing of the signal. The system produces an output for each article detected which is utilized in control circuitry for controlling external machine operations in response to various detected conditions.

6 Claims, 5 Drawing Figures

ARTICLE DETECTION SYSTEM WITH SYNCHRONOUS DEMODULATION

BACKGROUND OF THE INVENTION

The present invention is directed to improvements in article detection systems, and more particularly to systems for optically detecting and counting such articles.

In the commonly assigned Hinds Pat. No. 3,964,041 there is disclosed an article detection system and method which was described as particularly useful in counting container ends. As indicated in that patent, it had been the practice in the production and packaging of articles, such as container ends, to package an approximate number of ends based on the assumption that a given number of nested ends would fit within a certain dimension. Since that assumption was only an approximation for the reasons indicated therein, it was the practice to add a "few extra" ends to insure that the package stack contained the minimum number. At the rate at which such articles were being packaged, about 300-500 ends per minute, the number of "extras" resulted in substantial additional costs.

The system and method disclosed in the aforementioned Hinds Pat. No. 3,964,041 was designed to provide an accurate system for counting the number of ends to permit packaging a desired number. While the system and method disclosed in said patent was a quantum improvement over previous techniques for approximating the number of articles in a package, that system in practice, did not achieve the exacting standards of accuracy for which it was designed.

It would be highly desirable, therefore, to minimize inaccuracies and errors in article detection and counting systems, and to provide a system which minimizes chances of error both in the detection of the articles to be counted and in the evaluation and processing of signals representative thereof.

SUMMARY OF THE INVENTION

In accordance with the present invention there is provided a system for detecting and counting articles, such as, for example, container ends, with a high degree of reliability and accuracy and for providing an output suitable for effecting desired control functions.

The article sensing, detection and counting system of the present invention provides optical detection of articles to be counted with minimal error, provides a system for minimizing any error occurring during the processing of signals resulting from such detection, and provides a system to effect control of apparatus to effectuate desired operations on the articles being counted.

The system in accordance with the present invention incorporates an optical transducer assembly which includes a first transducer for producing a modulated luminous sensing signal which is directed into a space where it may impinge on articles to be counted. The transducer assembly includes a second transducer which is responsive to the luminous sensing signal reflected from articles located in the impingement space. The transducer assembly is designed to preclude the sensing signal from being received by said second transducer except when reflected off of an article located in said impingement space.

The transducer responsive to the reflected sensing signal produces a feedback signal representative thereof which is processed to produce an output indicative of the sensing of an article. Additional control circuitry minimizes errors in the processing of the signal by driving the feedback signal away from a transition threshold level, i.e., accentuating the signal when an article is detected and attenuating the signal in the absence of the detection of an article.

Furthermore, in accordance with the present invention there is provided a control system utilized to provide external control signals, e.g., to control machine operations associated with the articles being counted. This system is responsive to the specific starting conditions such as the detection of a selected number of articles for initiating a predetermined operational sequence interrupted by any necessary time delays. Necessary feedback signals for insuring proper sequential operation of the apparatus is provided, as well as the capability of detecting jams and aborting the operational sequence under selected conditions.

Thus, a system incorporating the present invention may be used to count articles such as can ends being formed into the stack, provide an indication of the desired number of can ends and produce control signal for operation of a suitable mechanism in response to the detection of the desired number of articles.

The system of the present invention can be conveniently incorporated in a production line where articles such as can ends are being produced and in which such articles are moved past the transducers for detection. Alternatively, the system of the present invention may be incorporated in a self-contained portable unit readily used for checking, verification, and quality control in which the articles and portable unit are moved relatively to each other either by movement of the ends or articles past the unit or movement of the unit across a stack of stationary ends.

Numerous other advantages and features of the present invention will become readily apparent from the following detailed description of the invention and of one embodiment thereof, from the claims and from the accompanying drawing in which each and every detail shown is fully and completely disclosed as a part of this specification in which like numerals refer to like parts.

DESCRIPTION OF PREFERRED EMBODIMENT

Figure 1:
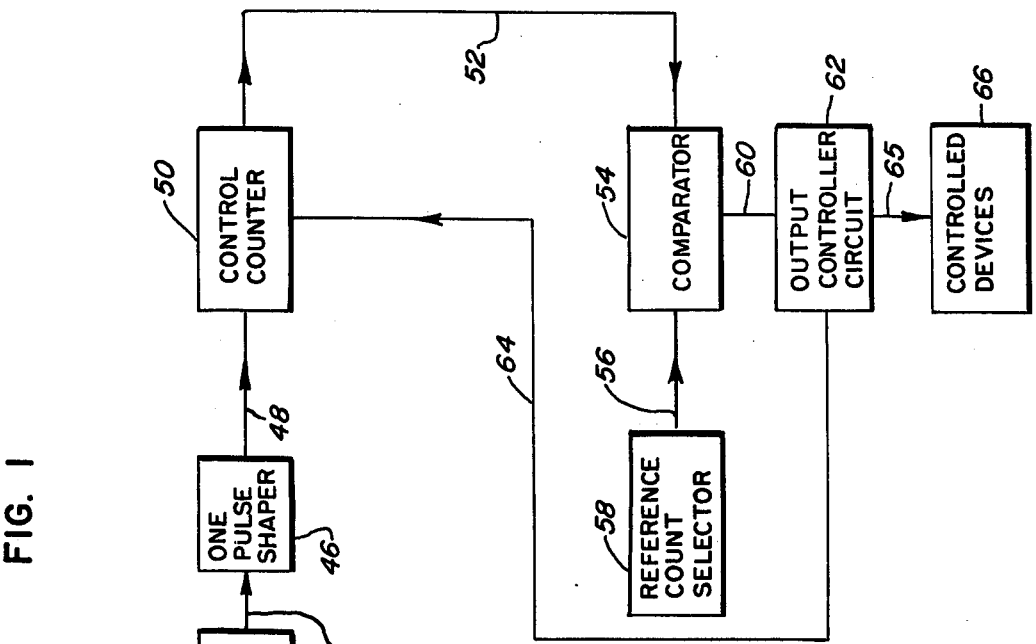
FIG. 1 is a block diagram of one embodiment of a system incorporating the present invention.

While this invention is susceptible of embodiment in many different forms, there is shown in the drawings and will herein be described in detail one specific embodiment, with the understanding that the present disclosure is to be considered as an exemplification of the principles of the invention and is not intended to limit the invention to the embodiment illustrated. The scope of the invention will be pointed out in the appended claims.

The article detection and counting system of the present invention includes a frequency and phase sensitive detector circuit 10 which produces a fixed frequency modulating signal at one of its outputs 12. The frequency sensitive detector is responsive to a signal at its input 14 of the same frequency and phase as the fixed frequency modulating signal to produce a detection signal at a second output 16.

The fixed frequency modulating signal produced at the first output 12 of the frequency sensitive detector 10 is amplified in a suitable amplifier 18. The output 20 of the amplifier 18 is applied as a modulating input to a suitable transducer 22 which produces a luminous sensing signal 24 oscillating at the frequency of the amplified output of the frequency sensitive detector 10.

The oscillating luminous signal 24 produced by the first transducer 22, e.g., a light emitting diode, is directed to a space 26 for impingement on articles 28 to be detected, e.g., can ends moving through the impingement space 26. The luminous signal 24 is reflected off each of the articles 28 and is sensed by a suitable light responsive transducer 30, e.g., a phototransistor, which produces at its output 32 a feedback signal oscillating at said fixed frequency and in phase with the modulating signal produced by the frequency sensitive detector 10.

This feedback signal is amplified in a feedback amplifier 34. The output 36 of the feedback amplifier 34 is input of a level control circuit 38. The level control circuit 38 controls the amplitude of the signal applied to the input 14 of the frequency and phase sensitive detector 10 to minimize switching errors, by selectively driving the amplitude of the feedback signal, the input 14 of the frequency sensitive detector 10, away from the switching threshold level.

Thus, when no article is detected, the level control circuit 38 attenuates the input 14 to the frequency sensitive detector. When there is an increase in the amplitude of the feedback signal sufficient to trigger the frequency sensitive detector 10 and to produce a detection output 16, the detection output 16, which is applied to the control input 40 of level control circuit 38 causes that circuit to effect an increase of the amplitude of the feedback signal to a value substantially greater than the switching threshold of the frequency sensitive detector 10.

This level control of the feedback signal minimizes the possibility of multiple counts being produced, for example, when an article 28 vibrates as it passes the impingement space 26. When an article passes impingement space 26 and the level of the feedback signal drops below the switching threshold, the output 16 of the frequency sensitive detector 10 terminates. As a result, the level control circuit 38 again attenuates the input 14 driving it away from the switching threshold level.

The detection output 16 of the frequency and phase sensitive detector 10 is amplified in a detection amplifier 42. The output 44 is passed through a one shot pulse shaper 46. The one shot 46 produces a shaped pulse 48 in response to each detection output 16, the pulses 48 are applied to a control counter 50. The control counter 50 counts the pulses 48 and produces coded outputs 52, which indicate the number of pulses 48 applied to the input of the counter 50. The outputs 52 are applied to a comparator 54. The other inputs to the comparator are the outputs 56 of a reference count selector 58 which is preset to a selected number.

Upon coincidence of the count in the control counter 50 and the count set into the reference count selector 58, an output 60 is produced to trigger the output control circuit 62. The output control circuit 62 produces a reset pulse 64 to reset the control counter 50 and produces control signals 65 to control the operation of external devices 66, as described in more detail below.

Figure 2:
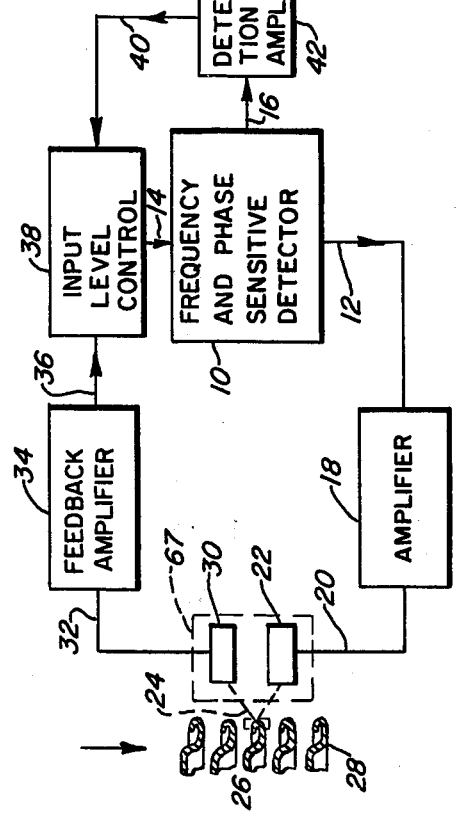
FIG. 2 is a sectional view taken along lines 2—2 of FIG. 3 of one embodiment of a transducer assembly.
Figure 3:
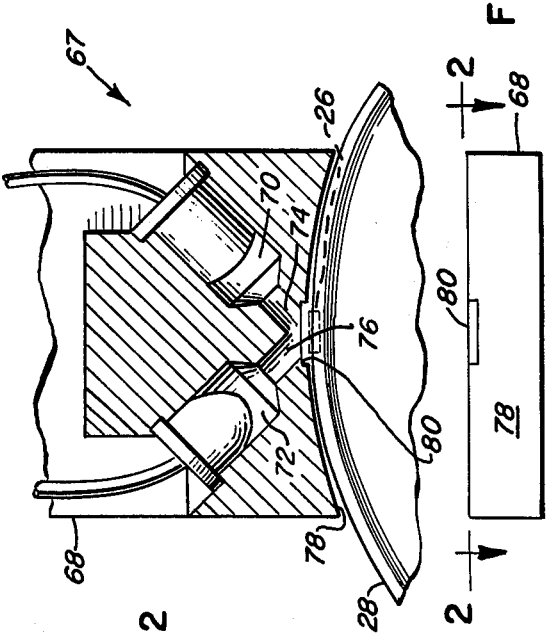
FIG. 3 is a bottom view of the transducer assembly.

Turning to FIGS. 2 and 3, there is shown in detail a transducer assembly 67 utilized in connection with the present invention in order to minimize sensing errors and increase the precision and accuracy of the system incorporating the present invention. The assembly 67 includes a transducer housing 68. In the illustrated embodiment, the transducer housing 68 is provided with a pair of transducer cavities 70, 72 adapted to receive and support the discrete transducers 22, 30, respectively. The cavities 70, 72 position the transducers 22, 30 supported therein at an angle to each other, which in the illustrated embodiment, is an included angle of 90°.

The cavities 70, 72 terminate at converging ends in small channels 74, 76, respectively. The axes of the channels 74, 76 intersect in the impingement space 26, where the sensing signal 24 impinges on an article 28 to be detected. The impingement space 26 includes the plane of the surface 78 of the transducer housing 68 through which the channels 74, 76 pass. The surface 78 may conveniently have a shape complementary to the shape of the articles to be detected to permit the surface of the articles to pass along the surface 78 of the housing 68, particularly at the impingement point 26.

In order to insure that the luminous sensing signal 24 reflecting from an article returns to the phototransistor 30, the article contacting surface 78 of the housing is provided with a recess or notch 80 located at the impingement space 26. The recess 80 is designed to minimize actual contact of the article with the housing to prevent build up of foreign materials that might prevent the sensing signal 24 produced by the light emitting diode 22 from impinging on the article 28 and reflecting back to the light responsive transducer or phototransistor 30.

As seen in the drawing, the articles 28 to be detected pass in a line transverse to the plane defined by the axes of the light channels 74, 76 formed in the transducer housing 68. In order to minimize erroneous detection, the size of the channels 74, 76 is kept small to keep the impingement space 26 small.

The impingement space 26 is the volume in which the sensing signal 24 may impinge on an article and be reflected back to the light responsive transducer 30. The lateral dimensions of the impingement space are defined by the areas of the channels 74, 76. In the illustrated embodiment, the width of the channels 74, 76 (in a direction parallel to movement of the articles through the impingement space 26) is substantially narrower than the width of the articles themselves to prevent impingement on more than one article at a time.

The depth of the impingement space is a function not only of the areas of the channels 74, 76, but also of the value of the included angle. The smaller the angle is, the deeper will be the impingement space 26. The included angle chosen is a function of the type of article to be detected and is designed to preclude erroneous detection of an article, double detection of an article from, for example, the sensing signal impinging on two different portions thereof.

Thus, the configuration of the transducer assembly 67, including the optical channels 74, 76, the included angle therebetween, the area of the channels, combine to increase the accuracy of detection of articles moving through the detection space.

Figure 4A:
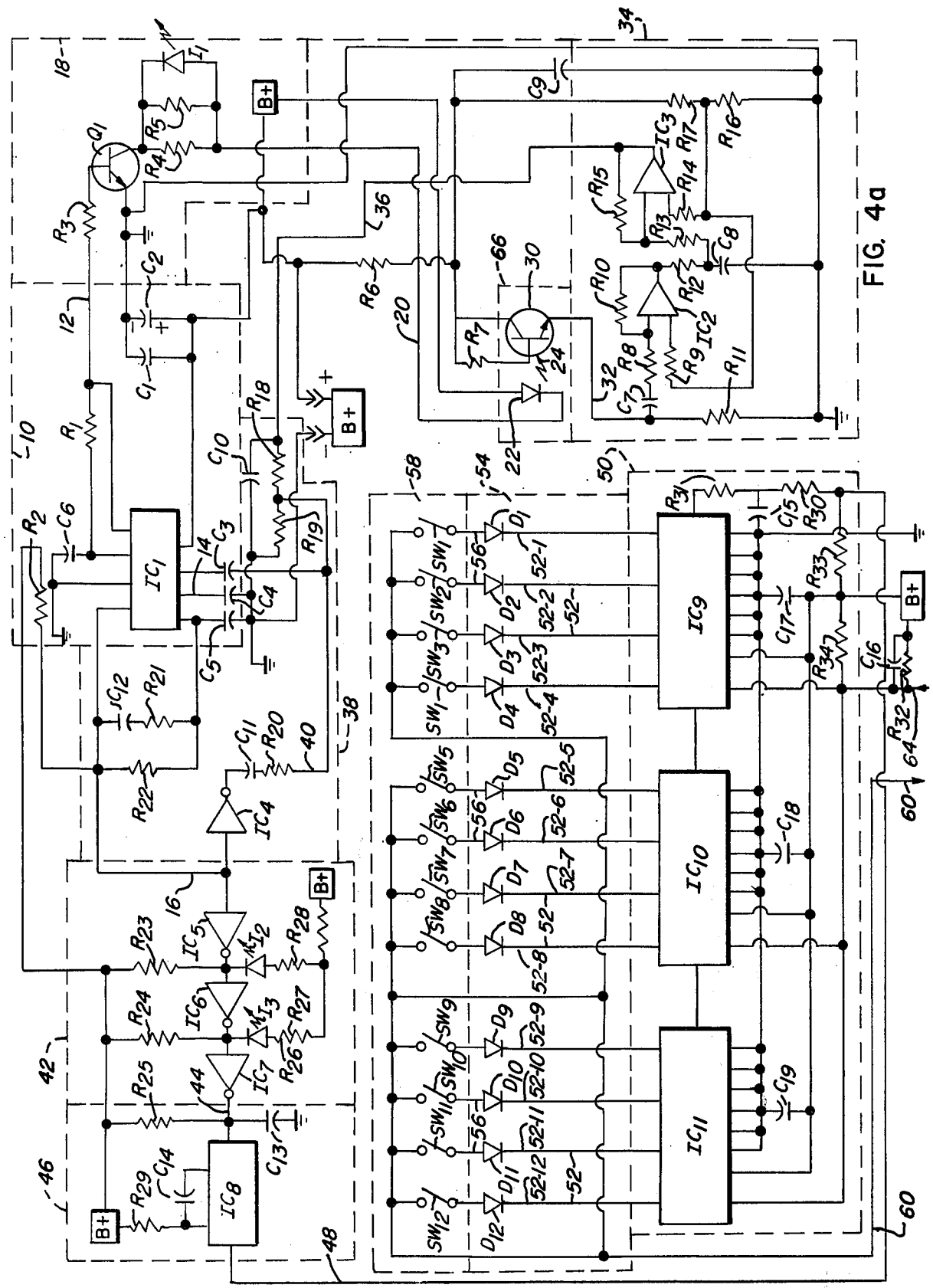
FIGS. 4a and 4b combined show a circuit diagram of a system incorporating the present invention.
Figure 4B:
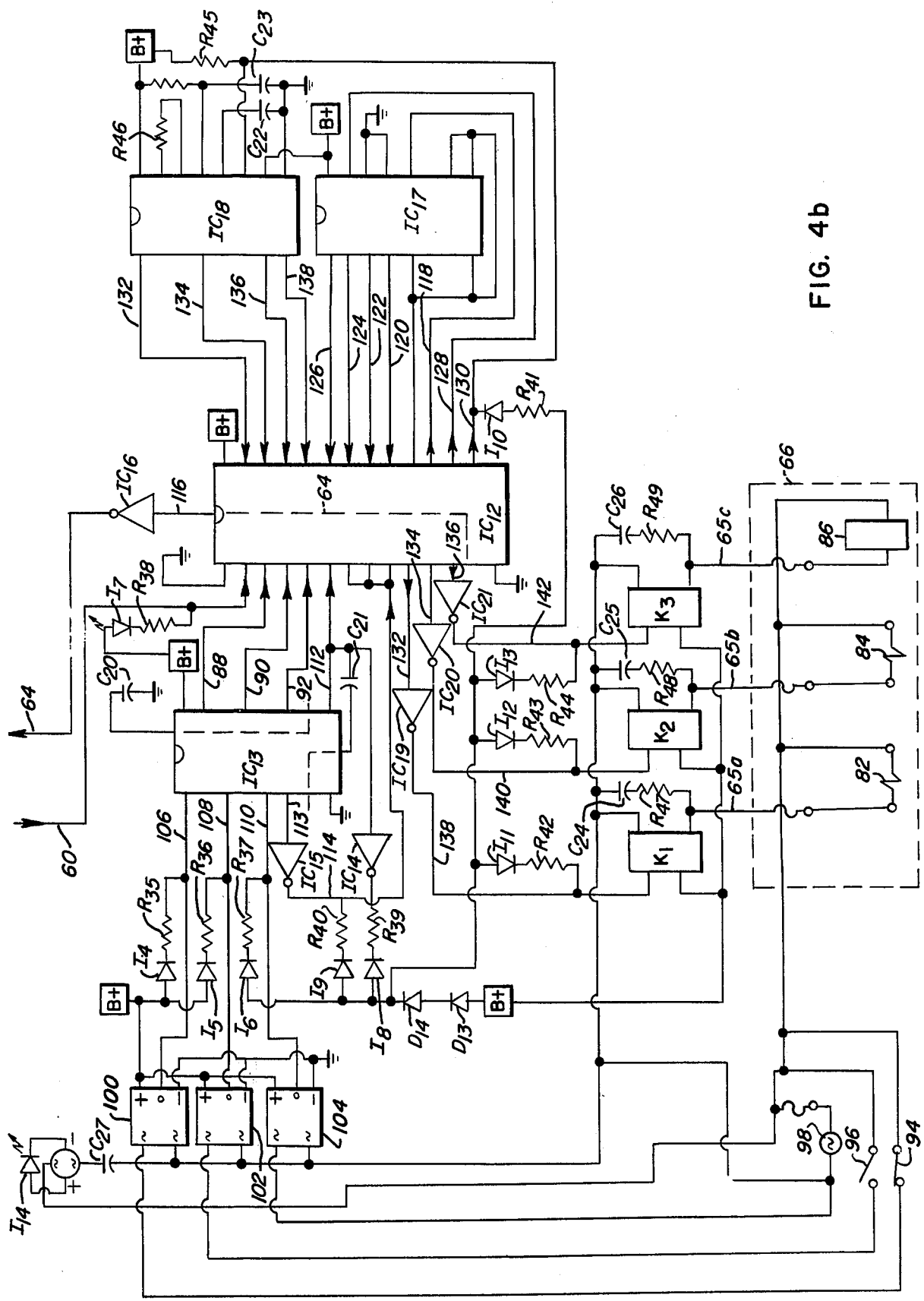

FIGS. 4a and 4b taken together comprise the circuit diagram of one embodiment of a system incorporating the present invention.

The heart of the frequency sensitive detector 10 is IC$_1$, a Signetics NE567 phase lock loop decoder. The modulating output 12 of the detector 10 is applied to the base of a transistor Q$_1$, which along with its associated circuitry make up amplifier 18. The output 20 of amplifier 18 energizes an indicator light emitting diode I$_1$ to indicate that a modulating output is being produced, and is also applied to the transducer 22 to effect modulation of the luminous sensing signal produced by the transducer 22.

When the luminous signal 24 is reflected off of an article to be detected it is sensed by the phototransistor 30 which produces an oscillating feedback signal 32 having an amplitude proportional to the intensity of the luminous signal impinging thereon. The feedback signal 32 is amplified in feedback amplifier 34.

Feedback amplifier 34 is a two stage amplifier which includes a pair of operational amplifiers IC$_2$ and IC$_3$ and associated circuitry. A low pass filter comprised of resistors R$_{12}$ and R$_{13}$ and capacitor C$_8$ is connected between the output of the first stage amplifier IC$_2$ and the input of the second stage amplifier IC$_3$ to attenuate undesirable high frequency noise.

The output 36 of amplifier 34 is connected to a pair of input resistors R$_{18}$ and R$_{19}$ forming part of the level control circuit 38. The level control input resistors R$_{18}$, R$_{19}$, are connected as a voltage divider. The junction between the resistors R$_{18}$, R$_{19}$ is connected to the output of a level control inverter IC$_4$ through bypass resistor R$_{20}$ and capacitor C$_{11}$. The input to the level control inverter IC$_4$ is the detection output 16 of the frequency sensitive detector 10. The output of the frequency sensitive detector 10 is high in the absence of an article being detected. As a result, the output of the inverter IC$_4$ is low to bypass part of any input signal 36 applied to the level control circuit input resistors R$_{18}$, R$_{19}$ to ground through bypass resistor R$_{20}$ and capacitor C$_{11}$.

When an article is detected, the amplitude of the signal 36 applied to the input resistors R$_{18}$, R$_{19}$ of the input level control circuit 38 even though partially attenuated is still sufficiently high to produce a detection output 16, which is low when an article is detected. When the detector output 16 goes low, the output of the inverter IC$_4$ goes high, thus terminating the bypass and the attenuation of the feedback signal 20. The amplitude of the feedback signal 12 is thus increased to drive it further beyond the switching threshold of the detector 10 to minimize the possibility of multiple detection signals being produced by a single article. The resistor R$_{21}$ and capacitor C$_{12}$ connected across the output 16 perform a chatter prevention function by biasing the detector output further from its threshold value in the brief interval following an output transition.

The output 16 of the detector 10 is also connected to the input of the detection amplifier 42 which comprises three series connected inverter amplifiers IC$_5$, IC$_6$ and IC$_7$, and associated circuitry. The output of the first two of these amplifiers is also connected to LED indicators I$_2$, I$_3$. When no article is detected, the output 16 of the detector 10 is high. The output of the first inverter IC$_5$ is low thus energizing indicator I$_2$ to show the absence of a detection. When an article is detected, the output 16 goes low. The output of the second inverter IC$_6$ thus goes low to energize the indicator I$_3$ showing that an article is being detected.

The output 44 of the detection amplifier 42 goes high when an article is detected and is applied to the input of a one shot pulse shaper 46, which includes IC$_8$ and associated circuitry. The one shot 46 produces a pulse 48 in response to the transition of the amplifier output 44 from low to high. Thus, a pulse output 48 is produced by the single shot 46 in response to each positive transition of the output 44 of the detection amplifier 42, i.e., in response to the initial detection of an article.

The pulse 48 is applied to the input of the control counter which comprises three counter stages IC$_9$, IC$_{10}$ and IC$_{11}$ and associated circuitry. The outputs 52 of each stage of the control counter is a binary coded decimal output. Thus, the first control counter stage IC$_9$ produces binary coded outputs 52-1 through 52-4 representative of the value of units digit, the second stage IC$_{10}$ produces binary coded outputs 52-5 through 52-8 representative of the tens digit, and the third stage IC$_{11}$ produces binary coded outputs 52-9 through 52-12 representative of the hundreds digit.

The outputs of the control counter 50 are connected to the comparator 54 which comprises a plurality of diodes D$_1$-D$_{12}$, one connected to each of the control counter outputs 52. The reference count selector 58 comprises a thumb wheel switch for selecting the desired number of articles. The thumb wheel closes the contacts SW-1 through SW-12 connected to the other side of the comparator diodes D$_1$-D$_{12}$ in accordance with the binary coded decimal value. Thus, in the illustrated embodiment, the reference count selector has been set to the number 408.

In operation, as long as the outputs 52 of the control counter 50 connected to a line containing a closed reference count selector switch SW1-12 remains low, the output 60 also remains low. When the control counter 50 has reached the value set into the reference counter 58, in the illustrated embodiment a count of 408, the outputs of the counter connected to those lines 52-1 through 52-12 where the switches SW$_1$-SW$_{12}$ are closed will all be high, and as a result the output 60 to the output control circuit 62 will also go high.

The output control circuit is shown in FIG. 4b. The output 60 from the comparator is applied to one input IC$_{12}$ a programmable logic array. The programmable logic array IC$_{12}$ controls the operation of the output control circuit 62 to produce the necessary control outputs 65 for controlling suitable mechanisms 66 with which system of the present invention is associated. The logic array IC$_{12}$ is responsive not only to the output 60 from the comparator 54 but also to external feedback signals from the controlled devices and internal timing signals within the control circuit.

A controlled device with which the system of the present invention may be utilized may be an end packaging system for groups of the desired number of ends. For example, when the desired number of ends have been counted, the group may be advanced by a suitable mechanism into a position where the ends may be packaged. The operation of the control circuit will be described with reference to such a system in which a mechanical device (not shown) grasps the stack of can ends and advances it away from the detection and counting system to a packaging system.

With this in mind, the control system produces a pair of control outputs, a gripping output 65a which energizes grip solenoid 82, and an advance output 65b which energizes an advance solenoid 84. A third output 65 is also shown which may be used to energize an additional apparatus, for example, a cumulative counter 86.

The control inputs to the programmable array IC$_{12}$ include not only the output 60 from the comparator 54, but feedback inputs 88, 90, 92 which are representative of conditions of the external system. In the illustrated embodiment, two of the inputs are used. These feedback inputs 88, 90 are indicative of the position of a pair of limit switches 94, 96. One switch 94 is closed when the end gripper (not shown) is in its back position and the other switch 96 is closed when the end gripper has moved to a forward position. These switches connect a source of ac power 98 to ac input modules 100, 102, respectively. The input modules 100, 102, and module 104 (not used) produce digitally compatable outputs 106, 108, 110, respectively. The outputs 106, 108 are low when the limit switches 94, 96 are closed and are high when the limit switches are open.

When the outputs 106, 108, 110 of the input modules 100, 102, 104 go low, corresponding indicators $I_4$, $I_5$ and $I_6$ connected to the corresponding output lines through resistors $R_{35}$, $R_{36}$ and $R_{37}$ are energized. The outputs 106, 108, 110 are applied to the inputs of a debouncer circuit $IC_{13}$, which includes an internal clock produces an output 112 is used as a system clock for the output control circuit. The clock output 112 energizes indicator $I_8$ through resistor $R_{39}$ and invertor $IC_{14}$.

The debouncer circuit $IC_{13}$ produces an output 88 corresponding to the output 106 produced by the input module 100, an output 90 which corresponds to the output 108 of the input module 102 and an output 92 corresponding to the output 110 of the input module 104.

When the system is first energized, the debouncer circuit $IC_{13}$ produces an output 113 until the B+ voltage achieves its stable level. Output 113 is applied to inverter $IC_{15}$. The output 114 of inverter $IC_{15}$, which is high until the voltage stablizes, energizes indicator $I_9$ through resistor $R_{40}$ and is applied to an input of the programmable array $IC_{12}$. As long as the output 114 is high, the programmable array produces a counter reset output 116 and a stepper reset output 118. The counter reset output 116 is applied to inverter $IC_{16}$, the output of which is counter reset signal 60. Stepper circuit $IC_{17}$ is, in effect, a counter which produces binary coded outputs 120, 122, 124, 126 representative of the number of pulses produced by the programmable array $IC_{12}$ at output 128 which is applied to the count input of the stepper circuit $IC_{17}$. Outputs of the stepper circuit $IC_{17}$ increase by one in response to each pulse applied to output 142 of programmable array $IC_{12}$.

The programmable array $IC_{12}$ also produces a timer enable output 130 which is applied to the enable input of timer circuit $IC_{18}$. Timer $IC_{18}$ is disabled except in the absence of enable input 130. When enabled, the timer $IC_{18}$ which is, in effect, a divider circuit, produces an output on lines 132, 134, 136, 138 at sucessively lower frequencies. For example, the timer may produce an 8 second pulse on line 138, a 4 second pulse on line 136, a one second pulse on line 134 and a one-eighth second pulse on line 132. The timer $IC_{16}$ thus provides outputs utilized for time delay purposes as is explained in more detail below.

The programmable array $IC_{12}$ produces control outputs 132, 134, 136 which are inverted in inverters $IC_{19}$, $IC_{20}$, and $IC_{21}$ respectively. When the outputs 132, 134 or 136 go high, the outputs 138, 140, 142 of the corresponding inverters $IC_{19}$, $IC_{20}$, and $IC_{21}$ go low. When the outputs 138, 140, 142 go low, corresponding indicators 110, 112 and 113 are energized through resistors R42, R43 and R44. The outputs 138, 140, and 142 are also applied to the inputs of solid state relays K1, K2, K3 which product outputs 65a, 65b, 65c, respectively, to energize corresponding solenoids 82, 84, 86, respectively. The solenoids when energized energize the corresponding element connected thereto.

In operation, when the power is turned on, the enable control 114 is high. As a result, the programmable array $IC_{12}$ produces a counter reset output 116 which is inverted by inverter $IC_{13}$ to produce reset signal 64 to reset the control counter 50. The array $IC_{12}$ also produces a stepper reset signal 118 to reset stepper circuit $IC_{17}$.

The binary coded output of stepper circuit $IC_{17}$ on lines 120, 122, 124, 126 is reset to zero. When the voltage control output 114 goes low, the system begins to operate.

The programmable array $IC_{12}$ is responsive to the zero output of stepper $IC_{17}$, and to the position of the limit switches 94, 96 shown in the drawing, which indicate that the mechanism is in proper starting position.

If these conditions are met, the programmable array $IC_{12}$ produces an output on line 128 to advance the stepper $IC_{17}$ to count one. At count one, the programmable array $IC_{12}$ awaits a pulse on line 60 from the comparator 54 indicating that the selected number of articles has been counted. When a pulse is applied to a programmable array $IC_{12}$ over line 60, a stepping pulse on line 128 is produced to advance the stepper outputs to count two.

When the outputs of the stepper $IC_{17}$ are at two, a signal is produced on line 132, inverted by inverter $IC_{19}$ to energize the solid state relay $K_1$ and therefore solenoid 82. In the suggested example, this operates a mechanism to grip the can ends preparatory to advancing them past the counter transducer assembly to another station, e.g., a packaging station. Simultaneously, the programmable array $IC_{12}$ also produces an output on line 130 to enable the timer $IC_{18}$.

After a delay determined by selected outputs of the timer $IC_{18}$, a counter reset pulse is produced on line 60 to reset the control 50 and enable the detection system to begin counting more articles. After a short additional time delay, another stepper advance pulse 128 is produced to advance the stepper $IC_{17}$ to count three.

At count three, the grip control signal 132 is maintained, and an advance signal 134 is also produced. This signal, applied to inverter $IC_{20}$ induces output control signal 140 to energize relay $K_2$ to begin advancing the stack of can ends. When the can ends advance, limit switch 94 opens indicating that movement of the stack has begun. In response to this condition, an additional advance pulse 128 is produced to advance the stepper to count four.

At count four, the gripping and advance signals 132, 134 continue and a timer enable signal 130 is produced. If limit switch 96 does not close before a predetermined time delay occurs, a stepper reset pulse 118 returns the output of stepper $IC_{17}$ to zero, thus aborting the operating cycle. If, however, the stack is moved as it should be, forward limit switch 96 closes before expiration of the selected time interval. When this occurs, an advance pulse 128 is produced to advance the stepper $IC_{17}$ to count five.

At count 5, the gripper or signal 132 is terminated, but the advance signal 134 is sustained. Simultaneously, the timer enable signal 130 is terminated thus disabling the timer $IC_{18}$. When the timer is disabled, all the outputs 146, 148, 150, 152 go high. When this occurs, a stepper pulse 128 advances the stepper $IC_{17}$ to count six.

At count six, the advance signal 134 continues, and a timer enable signal 130 is produced. After a preselected delay produced by the timer $IC_{18}$ a stepper pulse 128 is produced to advance the stepper $IC_{18}$ to count seven.

At count seven, the advance signal 134 is terminated. Under these conditions, the mechanism begins to return to its start position, in response, for example, to an automatic or return mechanism. When this occurs, the limit switch 96 opens and, therefore, the output 90 from the debouncer circuit $IC_{13}$ goes high.

When this occurs, an additional advance output 128 is produced to advance stepper $IC_{17}$ to count eight. At count eight, the array $IC_{12}$ responds to the closure of limit switch 96 indicative of the fact that the mechanism has returned to its starting position to produce another advance pulse 128.

The output of stepper $IC_{17}$ is thus advanced to count nine. At count nine, array $IC_{12}$ produces a timer enable signal 130. After a preselected time delay, a final advance output 128 is produced to reset the stepper $IC_{17}$ to step O where the cycle is repeated.

While the control functions and sequence described above are appropriate for one type of system being controlled, it is clear that the output control circuit could provide other control functions in response to other conditions for any appropriate external system to be controlled.

Thus, there has been disclosed an article detection and sensing system for accurately and reliably detecting and counting a number of articles and for producing a signal indicative of a selected number of articles being detected. This detection signal activates an output control system capable of providing desired control functions and of resetting the counting circuit to enable repetitive and recycled operation as long as the system is operating normally. The output control system is also responsive to external abnormalities and malfunction operations being controlled.

The accuracy of the article detection and sensing system of the present invention allows at least a portion of it to be incorporated into a self-contained portable unit. Such a portable unit might conveniently include all of the detection circuitry as well as a display type control counter. The accuracy with which the system of the present invention is capable of detecting articles will allow such a portable unit to be utilized under a variety of conditions and environments. The circuitry of the present invention permits such a portable unit to be powered by a portable source such as batteries and could incorporate low voltage indicators to provide information that the batteries required replacement or recharging and might also include a manual reset for the display counter.

Thus, the accuracy and preciseness of the system of the present invention not only can be utilized to improve efficiency and reduce cost in connection with normal production line operations and is also suitable for incorporation into self-contained portable units required to be operated under a variety of conditions.

The components utilized in the illustrated embodiment are as follows:

| | | | |
|---|---|---|---|
| $R_1$ | 3.9K | $R_{26}$ | Internal to $I_3$ |
| $R_2$ | 1K | $R_{27}$ | Internal to $I_2$ |
| $R_3$ | 3.9K | $R_{28}$ | 220 |
| $R_4$ | 100 | $R_{29}$ | 47K |

-continued

| | | | |
|---|---|---|---|
| $R_5$ | 100 | $R_{30}$ | 47 |
| $R_6$ | 82 | $R_{31}$ | 82 |
| $R_7$ | 3.3M | $R_{32}$ | 4.7K |
| $R_8$ | 1K | $R_{33}$ | 4.7K |
| $R_9$ | 15K | $R_{34}$ | 4.7K |
| $R_{10}$ | 120K | $R_{35}$ | Internal to $I_4$ |
| $R_{11}$ | 10K | $R_{36}$ | Internal to $I_5$ |
| $R_{12}$ | 1K | $R_{37}$ | Internal to $I_6$ |
| $R_{13}$ | 1K | $R_{38}$ | Internal to $I_7$ |
| $R_{14}$ | 10K | $R_{39}$ | Internal to $I_8$ |
| $R_{15}$ | 10K | $R_{40}$ | Internal to $I_9$ |
| $R_{16}$ | 1K | $R_{41}$ | Internal to $I_{10}$ |
| $R_{17}$ | 1K | $R_{42}$ | Internal to $I_{11}$ |
| $R_{18}$ | 1K | $R_{43}$ | Internal to $I_{12}$ |
| $R_{19}$ | 1K | $R_{44}$ | Internal to $I_{13}$ |
| $R_{20}$ | 560 | $R_{45}$ | 4.7K |
| $R_{21}$ | 10K | $R_{46}$ | 22K |
| $R_{22}$ | 330K | $R_{47}$ | 100 |
| $R_{23}$ | 4.7K | $R_{48}$ | 100 |
| $R_{24}$ | 4.7K | $R_{49}$ | 100 |
| $R_{25}$ | 4.7K | | |
| $I_{1-14}$ | Dialight Type 558 | | |
| $D_{1-12}$ | 1N914 | | |
| $D_{13-14}$ | 1N4001 | | |
| $C_1$ | 0.47 | $C_{15}$ | 1 |
| $C_2$ | 68 | $C_{16}$ | 0.1 |
| $C_3$ | 0.33 | $C_{17}$ | 0.47 |
| $C_4$ | 0.022 | $C_{18}$ | 0.47 |
| $C_5$ | 0.1 | $C_{19}$ | 0.47 |
| $C_6$ | 0.047 | $C_{20}$ | 47 |
| $C_7$ | 0.1 | $C_{21}$ | 0.022 |
| $C_8$ | 0.1 | $C_{22}$ | 0.01 |
| $C_9$ | 3.3 | $C_{23}$ | 0.1 |
| $C_{10}$ | 0.047 | $C_{24}$ | 0.1, 400V |
| $C_{11}$ | 0.1 | $C_{25}$ | 0.1, 400V |
| $C_{12}$ | 0.0047 | $C_{26}$ | 0.1, 400V |
| $C_{13}$ | 0.1 | $C_{27}$ | 0.22, 400V |
| $C_{14}$ | 0.1 | | |
| $IC_1$ | NE567V | $IC_{12}$ | 82S101 |
| $IC_2$ | 1/2 MC 1458 | $IC_{13}$ | MC 14490 |
| $IC_3$ | 1/2 MC 1458 | $IC_{14}$ | 1/6 SN 7406 |
| $IC_4$ | 1/6 SN 7406 | $IC_{15}$ | 1/6 SN 7406 |
| $IC_5$ | 1/6 SN 7406 | $IC_{16}$ | 1/6 SN 7406 |
| $IC_6$ | 1/6 SN 7406 | $IC_{17}$ | TIL 306 |
| $IC_7$ | 1/6 SN 7406 | $IC_{18}$ | 2240 |
| $IC_8$ | 1/2 SN 74221 | $IC_{19}$ | 1/6 SN 7406 |
| $IC_9$ | TIL 306 | $IC_{20}$ | 1/6 SN 7406 |
| $IC_{10}$ | TIL 306 | $IC_{21}$ | 1/6 SN 7406 |
| $IC_{11}$ | TIL 306 | | |

$Q_1$ 2N 3416
$K_{1,2,3}$ DIP Solid State 641-1
Input Modules 100, 102, 104 675-1
Transducer 22 - LED 5082-4658
Transducer 30 - CLR 2180

From the foregoing, it will be observed that numerous variations and modifications may be effected without departing from the true spirit and scope of the novel concept of the invention. It is, of course, intended to cover by the appended claims all such modifications as fall without the scope of the claims.

What is claimed is:

1. A system for sensing and detecting each of a plurality of moving, closely spaced articles comprising:
   first transducer means for producing a luminous sensing signal;
   frequency sensitive circuit means generating a continuous fixed frequency modulating signal, said frequency sensitive circuit means being responsive to a signal of said fixed frequency in phase with said generated signal for generating a first output and being responsive to the absence of a signal of said fixed frequency in phase with said generated signal for generating a second output;
   first circuit means for applying said fixed frequency signal to said first transducer means to effect oscillation of said sensing signal at said fixed frequency,
   second transducer means spaced from said first transducer means for sensing said luminous sensing signal and for producing an oscillating feedback signal representative thereof;

second circuit means for applying said oscillating feedback signal to the input of said frequency and phase sensitive circuit means in phase with said generated fixed frequency signal; and a housing containing said first and second transducer means at positions spaced from the periphery of said housing and from each other, said housing defining means for directing said sensing signal from said first transducer means of a volume located at the periphery of said housing and spaced from said first and second transducer means for impingement on each of the plurality of articles passing through said volume, for directing said sensing signal impinging on each of said articles to said second transducer means and for precluding said sensing signal from said second transducer means in the absence of an article in said volume, said directing means including:

a pair of channels diverging from a point of intersection at said periphery of said housing, one of said channels extending to said first transducer means and the other of said channels extending to said second transducer means, said channels defining light paths extending from each of said transducer means to said impingement volume where said light paths intersect in said impingement volume, the dimensions of said channels along a line generally parallel to the movement of said articles through said volume being substantially smaller than the dimension of said articles in the direction of said movement;

whereby said luminous sensing signal passing through said one of said channels and impinging on an article passing through said impingement volume is reflected to said second transducer means through the other of said channels.

2. A system as claimed in claim 1 wherein:
the included angle between the axes of said channels is 90°.

3. A system as claimed in claim 1 wherein:
the width of said channels transverse to the plane passing through the axes thereof is less than the width of the surface of the article on which said sensing signal impinges,
whereby said sensing signal is prevented from impinging on more than one article simultaneously.

4. A system as claimed in claim 1 including:
means selectively responsive to said first output for producing control signals;
control circuit means responsive to said control signals for selectively producing control output signals for an external apparatus; and
means responsive to selected conditions in said controlled external apparatus for producing feedback input signals representative of said selected conditions;
said control circuit means being selectively responsive to said feedback input signals for producing different ones of said control output signals.

5. A system as claimed in claim 4 including:
means for producing internal feedback control signals;
said control circuit means producing said different control output signals in response to each of a plurality of different combination of said control signals, said feedback input signals and said internal feedback control signals.

6. A system as claimed in claim 1 wherein:
said frequency sensitive circuit means is responsive to said oscillating feedback signal having a value exceeding a threshold condition for producing said first output and being responsive to said oscillating feedback signal having a value which does not exceed said threshold for producing a second output;
said system including:
circuit means responsive to said first output and to said feedback oscillating signal for increasing the value of said oscillating feedback signal beyond said threshold value and responsive to said second output and said feedback oscillating signal for attenuating said feedback oscillating signal below said threshold, whereby said system is less sensitive to minor variations in said feedback oscillating signal.

* * * * *